(12) United States Patent
Sakurada

(10) Patent No.: US 9,690,697 B2
(45) Date of Patent: Jun. 27, 2017

(54) MEMORY CONTROLLER, STORAGE DEVICE AND MEMORY CONTROL METHOD

(71) Applicant: Kabushiki Kaisha Toshiba, Minato-ku (JP)

(72) Inventor: Kenji Sakurada, Yamato (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 172 days.

(21) Appl. No.: 14/621,961

(22) Filed: Feb. 13, 2015

(65) Prior Publication Data

US 2016/0011970 A1    Jan. 14, 2016

Related U.S. Application Data

(60) Provisional application No. 62/022,968, filed on Jul. 10, 2014.

(51) Int. Cl.
| | |
|---|---|
| *G11C 29/00* | (2006.01) |
| *G06F 12/02* | (2006.01) |
| *G11C 11/56* | (2006.01) |
| *G11C 16/34* | (2006.01) |
| *G11C 29/50* | (2006.01) |
| *G11C 29/04* | (2006.01) |

(52) U.S. Cl.
CPC ...... *G06F 12/0246* (2013.01); *G11C 11/5628* (2013.01); *G11C 16/3427* (2013.01); *G06F 2212/7201* (2013.01); *G11C 2029/0411* (2013.01); *G11C 2029/5004* (2013.01)

(58) Field of Classification Search
CPC ..... G11C 8/08; G11C 11/5642; G11C 16/349; G11C 16/06; G11C 16/26; G11C 11/5628; G11C 16/0483; G11C 16/3418; G11C 16/3431; G11C 29/00; G11C 16/10; G11C 16/28; G11C 2211/5634; G11C 16/34; G11C 16/3404; G11C 16/3427; G11C 16/04; G11C 29/16
See application file for complete search history.

(56) References Cited

U.S. PATENT DOCUMENTS

| | | |
|---|---|---|
| 8,213,255 B2 | 7/2012 | Hemink et al. |
| 8,385,117 B2 | 2/2013 | Sakurada et al. |

(Continued)

FOREIGN PATENT DOCUMENTS

| | | |
|---|---|---|
| JP | 2010-165426 | 7/2010 |
| JP | 2012-181761 | 9/2012 |
| JP | 2013-520760 | 6/2013 |

*Primary Examiner* — Guerrier Merant
(74) *Attorney, Agent, or Firm* — Oblon, McClelland, Maier & Neustadt, L.L.P.

(57) ABSTRACT

According to one embodiment, a memory controller controlling a nonvolatile memory which stores a code word includes a read control unit which controls reading from the nonvolatile memory and a decoding unit which obtains likelihood information of each memory cells based on a reading result from the nonvolatile memory and decodes the code word by using the likelihood information, wherein the decoding unit obtains the likelihood information of a first memory cell based on the reading result of the first memory cell and the reading results of second memory cells which are one or more of the memory cells adjacent to the first memory cell.

19 Claims, 8 Drawing Sheets

(56) References Cited

U.S. PATENT DOCUMENTS

| | | | |
|---|---|---|---|
| 8,429,498 B1* | 4/2013 | Anholt | G06F 11/1048 365/227 |
| 2008/0055990 A1* | 3/2008 | Ishikawa | G11C 11/5628 365/185.09 |
| 2008/0198650 A1* | 8/2008 | Shalvi | G11C 16/26 365/185.02 |
| 2011/0066902 A1* | 3/2011 | Sharon | G11C 16/349 714/721 |
| 2011/0216598 A1* | 9/2011 | Kim | G11C 16/26 365/185.18 |
| 2012/0224420 A1* | 9/2012 | Sakurada | G11C 8/08 365/185.03 |
| 2013/0077400 A1* | 3/2013 | Sakurada | G11C 11/5642 365/185.03 |
| 2013/0155776 A1* | 6/2013 | Chilappagari | G11C 16/34 365/185.24 |
| 2013/0163328 A1* | 6/2013 | Karakulak | G11C 16/10 365/185.2 |
| 2013/0219108 A1 | 8/2013 | Yang | |
| 2014/0237200 A1* | 8/2014 | Dar | G11C 11/00 711/161 |

* cited by examiner

WRITE LEVEL OF ADJACENT CELL: LOW
INFLUENCE OF INTER-ADJACENT-CELL INTERFERENCE: SMALL

WRITE LEVEL OF ADJACENT CELL: HIGH
INFLUENCE OF INTER-ADJACENT-CELL INTERFERENCE: LARGE

ERROR RATE OF Erase to A IS HIGH

|       | Er |   |   |   | A |   |   |   |   | B |   |   |   |   | C |   |   |   |
|-------|----|----|----|----|----|----|----|----|----|----|----|----|----|----|----|----|----|----|
| SB4 (WL$_{n-1}$) | 1 | 1 | 1 | 1 | 1 | 1 | 1 | 1 | 1 | 1 | 1 | 1 | 1 | 0 | 0 | 0 | 0 |
| SB5 (WL$_{n+1}$) | 1 | 1 | 1 | 1 | 1 | 1 | 1 | 1 | 1 | 1 | 1 | 1 | 1 | 0 | 0 | 0 | 0 |

FIG.10

| HB  | 1  | 1  | 1  | 1  | 0  | 0  | 0  | 0  | 0  | 0  | 0  | 0  | 1  | 1  | 1  | 1  |
|-----|----|----|----|----|----|----|----|----|----|----|----|----|----|----|----|----|
| SB1 | 1  | 1  | 0  | 0  | 0  | 0  | 1  | 1  | 1  | 1  | 0  | 0  | 0  | 0  | 1  | 1  |
| SB2 | 1  | 0  | 0  | 1  | 1  | 0  | 0  | 1  | 1  | 0  | 0  | 1  | 1  | 0  | 0  | 1  |
| SB3 | 1  | 1  | 1  | 1  | 1  | 1  | 1  | 1  | 0  | 0  | 0  | 0  | 0  | 0  | 0  | 0  |
| LLR | -9 | -5 | -3 | -1 | +1 | +3 | +5 | +9 | +9 | +5 | +3 | +1 | -1 | -3 | -5 | -9 |

| | | | | | | | | | | | | | | | | |
|---|---|---|---|---|---|---|---|---|---|---|---|---|---|---|---|---|
| HB | 1 | 1 | 1 | 1 | 0 | 0 | 0 | 0 | 0 | 0 | 0 | 0 | 1 | 1 | 1 | 1 |
| SB1 | 1 | 1 | 0 | 0 | 0 | 0 | 1 | 1 | 1 | 1 | 0 | 0 | 0 | 0 | 1 | 1 |
| SB2 | 1 | 0 | 0 | 1 | 1 | 0 | 0 | 1 | 1 | 0 | 0 | 1 | 1 | 0 | 0 | 1 |
| SB3 | 1 | 1 | 1 | 1 | 1 | 1 | 1 | 1 | 0 | 0 | 0 | 0 | 0 | 0 | 0 | 0 |
| LLR | -9 | -6 | -4 | -2 | +1 | +2 | +4 | +8 | +9 | +5 | +3 | +1 | -1 | -3 | -5 | -9 |

US 9,690,697 B2

MEMORY CONTROLLER, STORAGE DEVICE AND MEMORY CONTROL METHOD

CROSS-REFERENCE TO RELATED APPLICATIONS

This application is based upon and claims the benefit of priority from U.S. Provisional Application No. 62/022,968, filed on Jul. 10, 2014; the entire contents of which are incorporated herein by reference.

FIELD

Embodiments described herein relate generally to a memory controller, a storage device, and a memory control method.

BACKGROUND

In a NAND flash memory (hereinafter, referred to as a NAND memory), information is stored according to a charge amount stored in a floating gate of a memory cell. In a writing period of the NAND flash memory, by injecting charges into the memory cell, the charge amount of the memory cell is changed according to a data value which is to be stored. In each memory cell, the charge amount is changed due to the occurrence of capacitive coupling between adjacent memory cells in a word line direction and a bit line direction. The change in charge amount is called inter-adjacent-cell interference. If the inter-adjacent-cell interference occurs, the charge amount of the memory cell becomes different from the charge amount corresponding to the stored data value, so that, in a reading period, an erroneous data value may be read.

BRIEF DESCRIPTION OF THE DRAWINGS

FIG. 8 is a diagram illustrating an example of soft bit information output from a NAND control unit in the case of reading an upper page;

FIG. 9 is a diagram illustrating an example of an output value of adjacent-WL information in the case of reading both of $WL_{n-1}$ and $WL_{n+1}$;

FIG. 10 is a diagram illustrating an example of a normal LLR table of an upper page;

DETAILED DESCRIPTION

In general, according to one embodiment, a memory controller controlling a nonvolatile memory which is configured to include a plurality of bit lines, a plurality of word lines, and a plurality of memory cells connected to the bit lines and the word lines to store a code word includes a read control unit which controls the nonvolatile memory to perform reading and a decoding unit which obtains likelihood information of each memory cell based on a reading result output from the nonvolatile memory and decodes the code word by using the likelihood information corresponding to the code word, wherein the decoding unit obtains the likelihood information of a first memory cell which is one of the memory cells based on the reading result of the first memory cell and the reading results of second memory cells which are one or more of the memory cells adjacent to the first memory cell.

Exemplary embodiments of a memory controller, a storage device, and a memory control method will be explained below in detail with reference to the accompanying drawings. The present invention is not limited to the following embodiments.

First Embodiment

Figure 1:
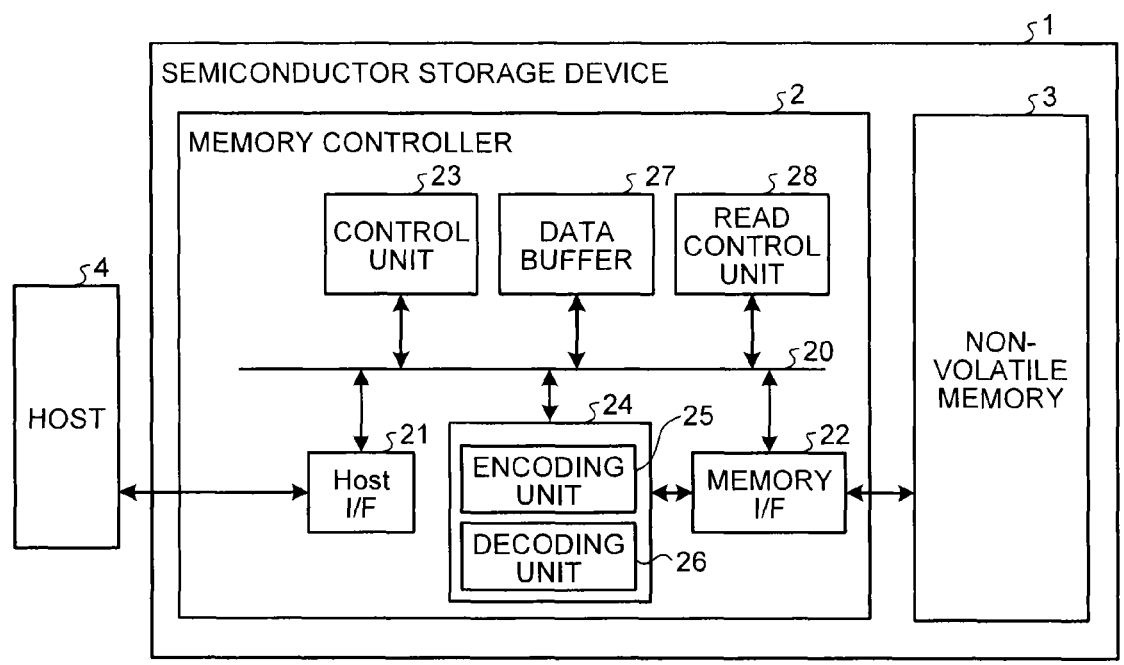
FIG. 1 is a block diagram illustrating an example of a configuration of a storage device according to an embodiment.

FIG. 1 is a block diagram illustrating an example of a configuration of a storage device (semiconductor storage device) according to a first embodiment. The semiconductor storage device 1 according to the first embodiment is configured to include a memory controller 2 and a nonvolatile memory 3. The semiconductor storage device 1 may be connected to a host 4, and FIG. 1 illustrates a state where the semiconductor storage device 1 is connected to the host 4. The host 4 is an electronic device, for example, a personal computer, a mobile terminal, or the like.

The nonvolatile memory 3 is a nonvolatile memory which stores data in a nonvolatile manner, for example, a NAND memory. In addition, herein, an example where the NAND memory is used as the nonvolatile memory 3 is described, but memories other than the NAND memory may be used. Writing and reading with respect to the nonvolatile memory 3 are performed in units of data which are called a page. The nonvolatile memory 3 is configured to include a plurality of word lines and a plurality of bit lines. In this specification, the memory cells commonly connected to one word line are defined as a memory cell group. In a case where the memory cell is a single-level cell, the memory cell group corresponds to one page. In a case where the memory cell is a multi-level cell, the memory cell group corresponds to plural pages. For example, in the case of using two-bit storable (2 bits/cell) multi-level cells, the memory cell group corresponds to two pages. In the case of using three-bit storable (three bits/cell) multi-level cells, the memory cell group corresponds to three pages.

The memory controller 2 controls writing of the nonvolatile memory 3 according to a write command from the host 4. In addition, the memory controller 2 controls reading of the nonvolatile memory 3 according to a read command from the host 4. The memory controller 2 is configured to include a host I/F 21, a memory I/F 22 (memory control unit), a control unit 23, an encoding/decoding unit 24, a data buffer 27, and a read control unit 28, which are connected to each other via an internal bus 20.

The host I/F 21 outputs commands, and user data (write data), and the like received from the host 4 to the internal bus 20. In addition, the host I/F 21 transmits the user data read from the nonvolatile memory 3, responses from the control unit 23, and the like to the host 4.

The memory I/F 22 controls a process of writing the user data or the like in the nonvolatile memory 3 and a process of reading the user data or the like from the nonvolatile memory 3 based on instructions of the control unit 23.

The encoding/decoding unit 24 is configured to include an encoding unit 25 and a decoding unit 26. The encoding unit 25 encodes the user data to generate a code word. In the embodiment, data having a predetermined data size constituting the code word are called an error check and correct (ECC) frame. One ECC frame of data is stored in one page or plural pages of the nonvolatile memory 3. The decoding unit 26 decodes the code word. As an encoding scheme used by the encoding/decoding unit 24, low density parity check (LDPC) encoding may be used. The encoding scheme is not limited thereto. Similarly to the LDPC encoding, the decoding unit 26 may perform the decoding using likelihood information.

The control unit 23 controls the semiconductor storage device 1 overall. The control unit 23 is, for example, a central processing unit (CPU), a micro processing unit (MPU), or the like. When the control unit 23 receives a command from the host 4 via the host I/F 21, the control unit 23 performs control according to the command. For example, when the control unit 23 receives a write request from the host 4, the control unit 23 instructs the encoding unit 25 to perform encoding of the user data which is to be written. In addition, the control unit 23 instructs the memory I/F 22 to perform writing of the code word generated by the encoding unit 25 in the nonvolatile memory 3. In addition, when the control unit 23 receives a read request from the host 4, the control unit 23 instructs the memory I/F 22 to perform reading of the code word from the nonvolatile memory 3. In addition, the control unit 23 instructs the decoding unit 26 to perform decoding of the code word read from the nonvolatile memory 3. The control unit 23 manages a write destination of the code word on the nonvolatile memory 3 (physical address on the nonvolatile memory 3).

The data buffer 27 temporarily stores the user data received from the host 4 until the user data are stored in the nonvolatile memory 3, and the data buffer 27 temporarily stores the data read from the nonvolatile memory 3 until the data are transmitted to the host 4. The data buffer 27 is configured with a general-purpose memory, for example, a static random access memory (SRAM), a dynamic random access memory (DRAM), or the like.

The read control unit 28 performs read control for determining whether or not influence of inter-adjacent-cell interference is large at the time of reading data from the nonvolatile memory 3. More specifically, at the time of performing the reading from the memory cell group corresponding to a read-object page, the read control unit 28 controls reading of a specified read voltage with respect to a memory cell group connected to a word line adjacent to the word line connected to the aforementioned memory cell group. Hereinafter, in this specification, for the simplification of description, the reading with respect to a memory cell group connected to a word line is expressed by reading of a word line. Details of the read control according to the embodiment will be described later.

FIG. 1 illustrates an example of a configuration where the memory controller 2 is configured to include the encoding/decoding unit 24 and the memory I/F 22. However, the memory I/F 22 may be built in the encoding/decoding unit 24. In addition, any of the memory I/F 22, the control unit 23, and the encoding/decoding unit 24 may be built in the read control unit 28.

Figure 2:
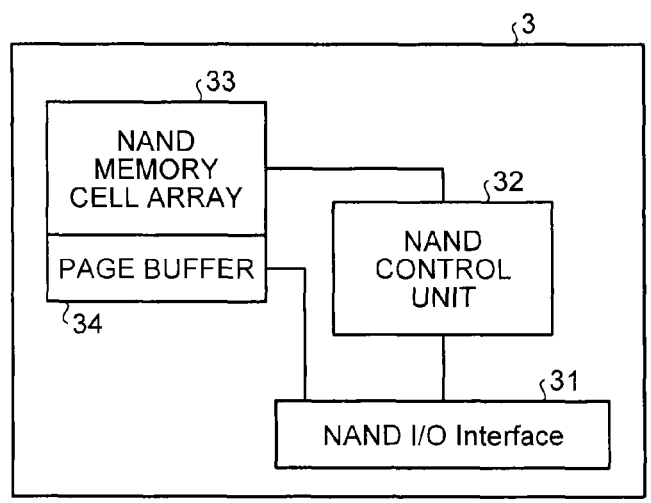
FIG. 2 is a block diagram illustrating an example of a configuration of a nonvolatile memory according to an embodiment.

FIG. 2 is a block diagram illustrating an example of a configuration of the nonvolatile memory 3 according to the embodiment. The nonvolatile memory 3 is configured to include a NAND I/O interface 31, a NAND control unit 32, a NAND memory cell array (memory cell unit) 33, and a page buffer 34.

The NAND control unit 32 controls operations of the nonvolatile memory 3 based on commands or the like input from the memory controller 2 via the NAND I/O interface 31. More specifically, when a write request is input, the NAND control unit 32 controls writing of data for the write request in a specified address on the NAND memory cell array 33. In addition, when a read request is input, the NAND control unit 32 controls reading of data for the read request from the NAND memory cell array 33 and outputting of the data to the memory controller 2 via the NAND I/O interface 31. The page buffer 34 is a buffer which temporarily stores the date input from the memory controller 2 at the time of writing in the NAND memory cell array 33 and which temporarily stores the data read from the NAND memory cell array 33.

The NAND memory cell array 33 is configured to include a plurality of word lines, a plurality of bit lines, and a plurality of memory cells. The memory cells are connected to the word lines and the bit lines.

In the NAND memory, at the time of writing data, charges are injected according to the data value so that the number of electrons (charge amount) of the floating gate corresponds to any one of plural distributions (threshold value distributions). For example, in the case of one bit/cell, the one of two distributions corresponds to "0", and the other corresponds to "1". When a voltage is applied to the memory cell, if the applied voltage is equal to or higher than the voltage value corresponding to the charge amount of the memory cell, a current flows. If the applied voltage is lower than the voltage value, no current flows. Therefore, the voltage at the boundary line of each memory cell is defined according to the charge amount of the memory cell. Herein, the voltage defined according to the charge amount of the memory cell is called a threshold value voltage. Therefore, in an initial state, charges are injected so as to correspond to any one of two threshold value distributions, and in a reading period, by applying a reference read voltage which separates the two threshold value distributions to the memory cell, it is possible to determine whether or not the data which are stored in the memory cell are "1".

Figure 3:
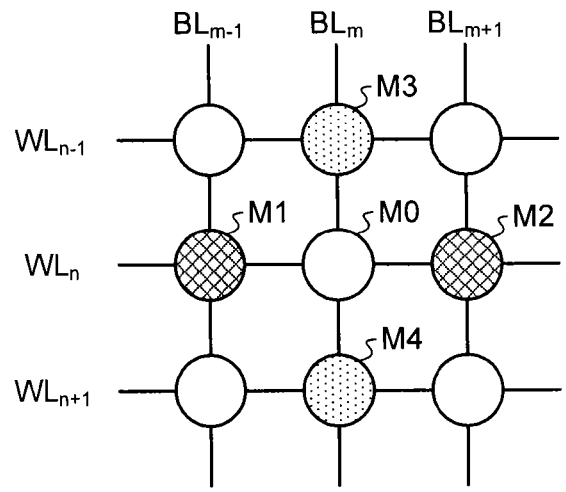
FIG. 3 is a concept diagram illustrating adjacent cells.

In the NAND memory, each memory cell is connected to the word line and the bit line. In each memory cell, due to the occurrence of capacitive coupling between memory cells (hereinafter, referred to as adjacent cells) adjacent in the word line direction and the bit line direction, the charge amount is changed, and the threshold value voltage is changed. The change in threshold value voltage due to the influence of the adjacent cells is called inter-adjacent-cell interference. FIG. 3 is a concept diagram illustrating the adjacent cells. As illustrated in FIG. 3, the memory cell M0 is influenced by the adjacent cells M1 and M2 adjacent in the word line direction and by the adjacent cells M3 and M4 adjacent in the bit line direction. If the inter-adjacent-cell interference occurs, the charge amount of the memory cell becomes different from the charge amount corresponding to the stored data value, so that, in the reading period, an erroneous data value may be read.

Figure 4:
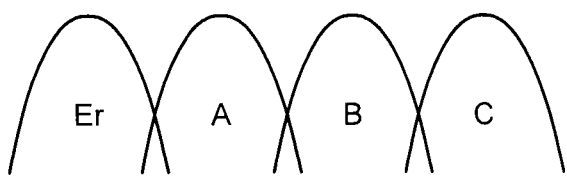
FIG. 4 is a concept diagram illustrating a behavior of a change in threshold value distribution according to influence of inter-adjacent-cell interference.
Figure 4:
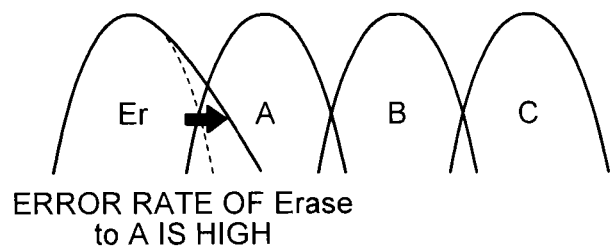

FIG. 4 is a concept diagram illustrating a behavior of the change in threshold value distribution according to influence of the inter-adjacent-cell interference. FIG. 4 illustrates an example of the influence of the inter-adjacent-cell interference in the case of using two-bits/cell memory cells. In the case of using the two bits/cell, two-bit data values are allocated to four threshold value distributions. The four threshold value distributions are defined as threshold value distributions Er (Erase), A, B, and C in the ascending order of the threshold value voltages. Hereinafter, the threshold value distributions Er, A, B, and C (first, second, third, and fourth threshold value distributions) are referred to as Er, A, B, and C levels. The upper figure of FIG. 4 illustrates influence of the inter-adjacent-cell interference in a case where the write level of the adjacent cell is low, and the lower figure of FIG. 4 illustrates influence of the inter-adjacent-cell interference in a case where the write level of the adjacent cell is high. The case where the write level of the adjacent cell is high denotes, for example, the case where the C level is written in the adjacent cell, and the case where the write level of the adjacent cell is low denotes the case where the Er, A, or B level is written in the adjacent cell. As illustrated in FIG. 4, in a case where the write level of the adjacent cell is high, the threshold value distribution of the Er level spreads toward the A level side. Therefore, the possibility that the memory cell where the Er level is written is erroneously read as the A level in the reading period becomes high.

In other words, in the memory cell which is read as the Er level in the reading period, certainty, that is, likelihood of the read data is different from the case where the C level is written in the adjacent cell and the case where the Er, A, or B level is written in the adjacent cell. Therefore, in the embodiment, likelihood information used by the decoding unit 26 is changed according to the write level of the adjacent cell. Accordingly, it is possible to reduce an error of the read data after the decoding.

Next, read control and selection of the likelihood information according to the embodiment will be described in detail. In the description hereinafter, an example two-bits/cell memory cells are used as the memory cells of the nonvolatile memory 3 will be described. In the case of using the two-bits/cell memory cells, two-bit data values are allowed to correspond to the four threshold value distributions of the Er, A, B, and C levels. This correspondence is referred to as data coding. The data coding is defined in advance, and in the data writing (programming) period, charges are injected into the memory cells so that the level (threshold value distribution) corresponding to the data value stored according to the data coding is formed. In addition, in the case of using the two bits/cell, one memory cell group corresponds to two pages. Two bits which are storable in each memory cell correspond to the two pages, respectively. In the embodiment, the two pages are referred to as a lower page and an upper page.

Figure 5:
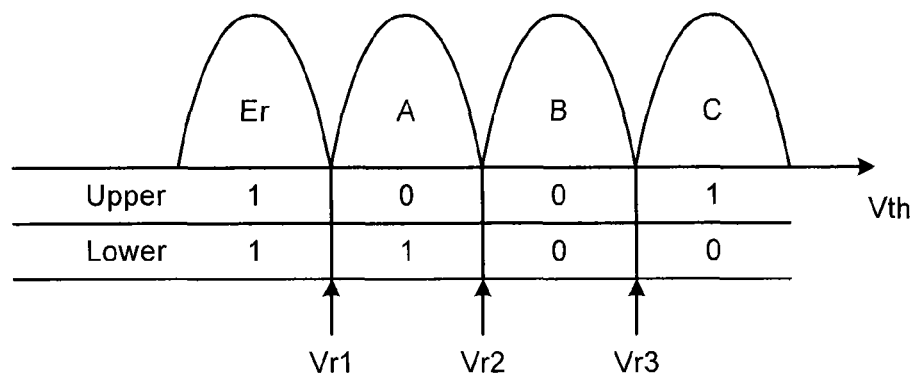
FIG. 5 is a diagram illustrating an example of data coding according to an embodiment.

FIG. 5 is a diagram illustrating an example of data coding according to the embodiment. As illustrated in FIG. 5, the Er level corresponds to a data value of "11"; the A level corresponds to a data value of "01"; the B level corresponds to a data value of "00"; and the C level corresponds to a data value of "10". In the embodiment, when the data of the upper page are denoted by $D_U$ and the data of the lower page are denoted by $D_L$, the two-bit data value is denoted by "$D_U D_L$". The data coding illustrated in FIG. 5 is an exemplary one, and the data coding is not limited to the example illustrated in FIG. 5. The threshold value voltage (hereinafter, referred to as a boundary voltage) at the boundary between the Er level and the A level is denoted by Vr1, the boundary voltage between the A level and the B level is denoted by Vr2, and the boundary voltage between the B level and the C level is denoted by Vr3.

In the embodiment, since the decoding unit 26 performs a decoding process using the likelihood information, reading from the nonvolatile memory 3 according to soft bit reading is performed. In the soft bit reading, a reference voltage for determination of the bit value is defined as a hard bit reading voltage (HB), and reading according to the HB and plural read voltages of each side of the HB is performed.

Figure 6:
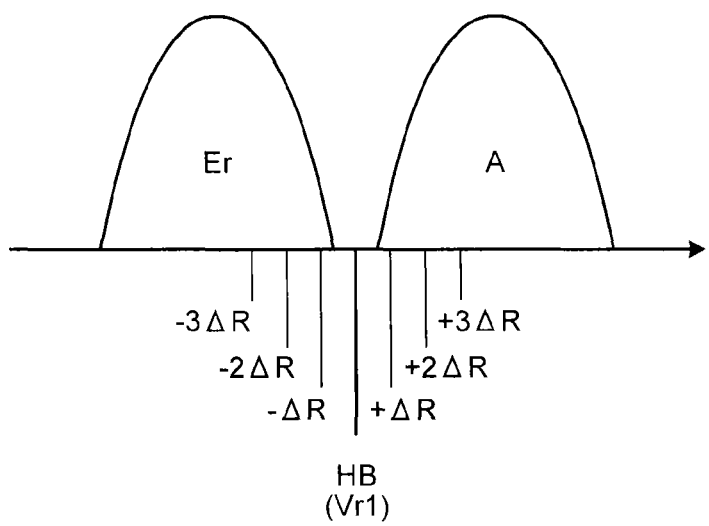
FIG. 6 is a diagram illustrating an example of a read voltage applied in a soft bit reading period.

FIG. 6 is a diagram illustrating an example of the read voltages applied in the soft bit reading period. FIG. 6 illustrates the read voltages applied in the soft bit reading period in a case where the boundary voltage Vr1 between the Er level and the A level is denoted by the HB. In the example illustrated in FIG. 6, the HB, the three points (+ΔR, +Δ2R, and +Δ3R) of the upper side of the HB, and the three points (−ΔR, −Δ2R, −Δ3R) of the lower side of the HB are applied. Hereinafter, an example where the read voltages of the three points of each of the upper and lower sides of the HB are applied in the soft bit reading as illustrated as an example in FIG. 6 will be described. In addition, the number of read voltages applied at the upper and lower sides of the HB is not limited to three. Similarly, in the soft bit reading period, in a case where the boundary voltage Vr2 or Vr3 is defined as the HB, the read voltages of the three points of each of the upper and lower sides of the HB are applied.

In the case of reading data from the NAND memory cell array 33, the read control unit 28 instructs the nonvolatile memory 3 to perform the soft bit reading. In addition, since the decoding unit 26 performs the decoding in units of an ECC frame (code word), the read control unit 28 instructs the reading so that data corresponding to the ECC frame are continuously read. At this time, in the case of reading the upper page, after the read control unit 28 instructs the soft bit reading of the word line of the read object, and the read control unit 28 instructs manual reading of the word line adjacent to the read-object word line. The NAND control unit 32 performs the reading according to the instructions from the read control unit 28 of the memory controller 2. In the case of performing the soft bit reading, the NAND control unit 32 determines whether or not the threshold value voltage of the memory cell is equal to or higher than the applied read voltages of the seven points (the HB and the three points of each of the upper and lower sides of the HB). Next, the NAND control unit 32 outputs a result of the determination, that is, a result of the soft bit reading as soft bit information to the memory controller 2 via the NAND I/O interface 31. Herein, in order to reduce the amount of data output from the nonvolatile memory 3 to the memory controller 2, seven reading results corresponding to the read voltages of the seven points are not output, but the soft bit information calculated based on the reading results is output.

More specifically, in the reading period of the lower page, total three pieces of information including the reading results (hard determination value) of the HB and SB1 and SB2 are output as the soft bit information. In the reading period of the upper page, total five pieces of information including the reading results of the HB and SB1, SB2, SB3, and SB4 are output as the soft bit information.

The SB1 is exclusive-NOR (ENOR) of the reading result of +Δ2R and the reading result of the −Δ2R. When EXNOR of the −Δ3R and the −ΔR is denoted by ENOR1 and EXNOR of the ENOR1 and the +ΔR is denoted by ENOR2, the SB2 is EXNOR of the ENOR2 and the +3ΔR. The SB3 is the reading result of the HB of the lower page (the reading result in the case of applying the read voltage Vr2). The SB4 is information indicating the reading result of the word line adjacent to the read-object word line. Details of the SB4 will be described later.

With respect to the lower page, the change of the data value occurs between the A level and the B level, and the influence of the inter-adjacent-cell interference illustrated in FIG. 4 is small. Therefore, in the embodiment, in the reading period of the lower page, the read control considering the later-described inter-adjacent-cell interference is not performed, but only the reading of the read-object word line is performed. Therefore, the reading results of the read-object word line (the reading results of the HB and the SB1 and the SB2) are input of the decoding unit 26 of the memory controller 2. The decoding unit 26 performs the decoding using the input reading results and a table for calculating the likelihood information. In the embodiment, a log likelihood ratio (LLR) is used as the likelihood information. In addition, in the embodiment, the table for calculating the likelihood information is called an LLR table. In the LLR table, correspondence between the reading results output from the nonvolatile memory 3 and the LLR is stored.

In the case of reading the upper page, the read control considering the inter-adjacent-cell interference is performed. More specifically, the NAND control unit 32 performs the soft bit reading of the read-object word line according to the instructions from the memory controller 2. In the soft bit reading of the read-object word line, the NAND control unit 32 performs the reading by using the boundary voltages Vr1, Vr2, and Vr3 as the read voltages. In addition, the NAND control unit 32 performs the reading by using the three points (+ΔR, +Δ2R, and +Δ3R) of the upper sides of each of the boundary voltages Vr1 and Vr3 and the three points (−ΔR, −Δ2R, and −Δ3R) of the lower sides of each of the boundary voltages Vr1 and Vr3 as the read voltages. Next, the NAND control unit 32 performs the reading of the word lines adjacent to the read-object word line by using the boundary voltage Vr3 as the read voltage according to the instructions from the memory controller 2. Accordingly, it is possible to determine whether or not the levels of the word lines adjacent to the read-object word line are the C level. In the embodiment, the NAND control unit 32 outputs the reading results of the word lines adjacent to the read-object word line by using the boundary voltage Vr3 as the read voltage as the SB4 to the memory controller 2.

When the number of word lines is denoted by Nw and n=0, 1, . . . , Nw, the n-th word line is denoted by $WL_n$. In the case of n=0, the word line adjacent to the $WL_n$ is only the $WL_{n+1}$. In the case of n=Nw, the word line adjacent to the $WL_n$ is only the $WL_{n-1}$. In the case of 1≤n≤Nw−1, the word lines adjacent to the $WL_n$ are the $WL_{n-1}$ and the $WL_{n+1}$.

There are methods of reading only the $WL_{n+1}$, only the $WL_{n-1}$, and both of the $WL_{n+1}$ and the $WL_{n-1}$ as the word lines. Among the methods, any method may be used. In addition, in the method of reading only the $WL_{n+1}$, when n=Nw, the $WL_{n-1}$ is read. In the method of reading only the $WL_{n-1}$, when n=0, the $WL_{n+1}$ is read. In the method of reading both of the $WL_{n+1}$ and the $WL_{n-1}$, when n=Nw, only the $WL_{n-1}$ is read; and when n=0, only the $WL_{n+1}$ is read.

Figure 7:
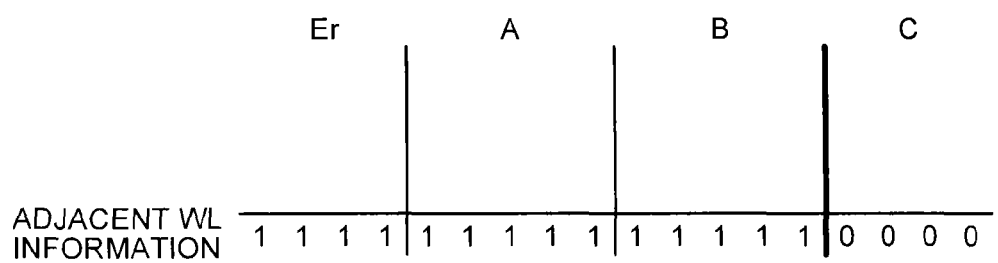
FIG. 7 is a diagram illustrating an example of an output value of adjacent-WL information in the case of reading $WL_{n+1}$.

FIG. 7 is a diagram illustrating an example of an output value of adjacent word line (WL) information (SB4) in the case of reading the $WL_{n+1}$. FIG. 7 illustrates an example using the method of reading only the $WL_{n+1}$ (reading the $WL_{n-1}$ when n=Nw). As illustrated in FIG. 7, the NAND control unit 32 outputs "0" as the SB4 with respect to the memory cell of which threshold value voltage is equal to or higher than the boundary voltage Vr3, and the NAND control unit 32 outputs "1" as the SB4 with respect to the memory cell of which threshold value voltage is lower than the boundary voltage Vr3.

Figure 8:
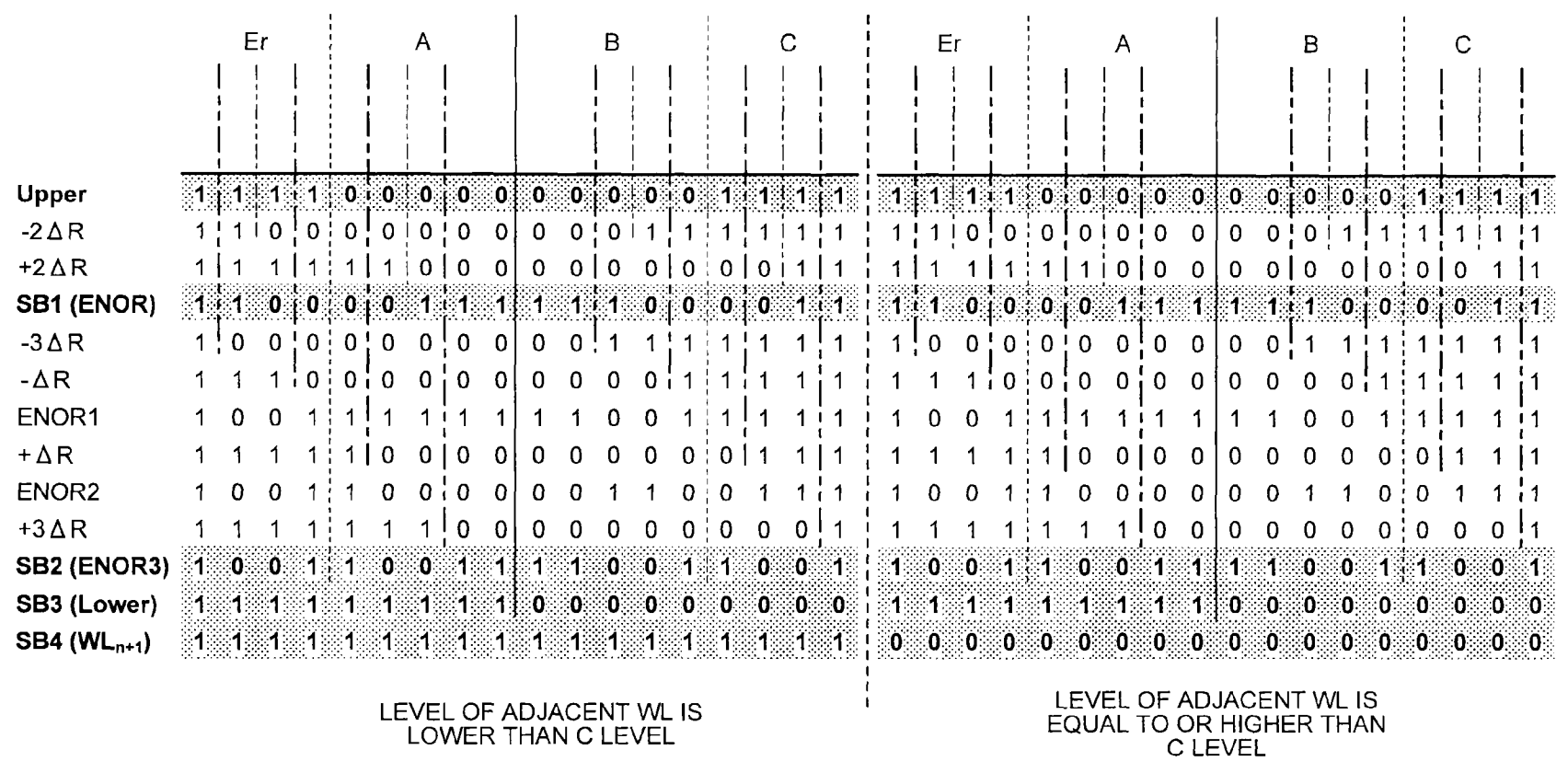

FIG. 8 is a diagram illustrating an example of the soft bit information output from the NAND control unit 32 in the case of reading the upper page. FIG. 8 illustrates an example using an output value indicated by the SB4 in FIG. 7. In FIG. 8, the first row Upper lists the reading result of the HB of the upper page, and the rows +ΔR, +Δ2R, +Δ3R, −ΔR, −Δ2R, and −Δ3R list the results of the soft bit reading by using the Vr1 and the Vr2 as reference. As described above, the SB1 and the SB2 are the values calculated based on the reading results of each read voltage, and the SB3 is the reading result of the HB of the lower page. In addition, the SB4 is the information indicating whether or not the level of each memory cell of the $WL_{n+1}$ illustrated in FIG. 7 is the C level. The left side of FIG. 8 illustrates the soft bit information in a case where the level of the memory cell of the $WL_{n+1}$ is lower than the C level (namely, any one of the Er level, the A level, and the B level), and the right side illustrates the soft bit information in a case where the level of the memory cell of the $WL_{n+1}$ is equal to or higher than the C level.

FIG. 9 is a diagram illustrating an example of an output value of adjacent-WL information in the case of reading both of the $WL_{n-1}$ and the $WL_{n+1}$. In the case of reading both of the $WL_{n-1}$ and the $WL_{n+1}$, the NAND control unit 32 outputs the SB4 and the SB5, which are the reading results of the $WL_{n-1}$ and the $WL_{n+1}$ in the case of using the boundary voltage Vr3 as the read voltage, as the reading results of the adjacent word lines. In addition, in the case of reading only the $WL_{n-1}$, the NAND control unit 32 outputs the SB4, which is the reading result of the $WL_{n-1}$ in the case of using the boundary voltage Vr3, as the read voltage.

As the reading results of the upper page, the NAND control unit 32 outputs total five pieces of information including the reading results of the HB and the SB1, the SB2, the SB3, and the SB4 or total six pieces of information including the reading results of the HB and the SB1, the SB2, the SB3, the SB4, and the SB5 as the soft bit information to the memory controller 2.

Figures 11, 12:
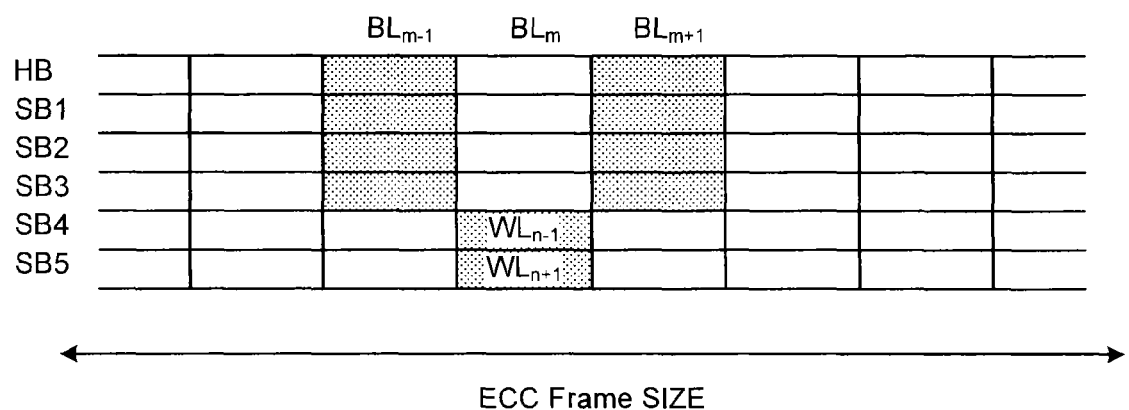
FIG. 11 is a diagram illustrating an example of an LLR table of an upper page for canceling interference.
FIG. 12 is a diagram illustrating a concept of a reading result of an upper page input to a decoding unit.

In the embodiment, the decoding unit 26 retains, in advance, a normal LLR table (first LLR table) considering the inter-adjacent-cell interference and an LLR table (second LLR table) for canceling interference considering the inter-adjacent-cell interference as LLR tables for decoding the upper page. In addition, with respect to the lower page, since the influence of the inter-adjacent-cell interference is small as described above, the LLR table for canceling interference may not be retained. FIG. 10 is a diagram illustrating an example of a normal LLR table of an upper page. FIG. 11 is a diagram illustrating an example of an LLR table for canceling interference of an upper page. The upper four rows (HB, SB1, SB2, and SB3) of FIGS. 10 and 11 list input values to the decoding unit 26, and the fifth row lists LLRs corresponding to the input values of the upper four rows. As understood from comparison of FIG. 10 with FIG. 11, in the LLR table for canceling interference, the absolute value of the LLR of the Er level is high, and the absolute value of the A level is low in comparison with the normal LLR table. FIGS. 10 and 11 are exemplary ones, and thus, the normal LLR table and the LLR table for canceling interference are not limited to the examples of FIGS. 10 and 11. In the LLR table for canceling interference, the absolute value of the LLR of the Er level may be high, and the absolute value of the LLR of the A level may be low in comparison with the normal LLR table.

The decoding unit 26 selects the LLR table used for the decoding based on the input reading results of the upper page. Herein, the method of selecting the LLR table is described. As described above, in the embodiment, in the reading period of the upper page, the NAND control unit 32 outputs the reading results (SB4 or SB4 and SB5) of the adjacent word lines. Accordingly, it is possible to determine whether or not the levels of the memory cells adjacent in the word line direction are the C level.

In addition, with respect to the memory cells adjacent in the bit line direction, it is possible to determine by using the reading results sequentially input to the decoding unit 26 whether or not the levels of the memory cells adjacent in the bit line are the C level. FIG. 12 is a diagram illustrating a concept of the reading results of the upper pages input to the decoding unit 26. The reading results of each memory cell corresponding to the ECC frame size are input to the decoding unit 26. When the m-th bit line is denoted by $BL_m$, the portions indicated by thin hatching in FIG. 12 illustrate the reading results of the memory cells connected to the $WL_n$ and connected to the $BL_m$. In the lower side, the portion indicated by $WL_{n-1}$ and the portion indicated by $WL_{n+1}$ illustrate the information of the memory cells adjacent to the word line. In addition, the dark hatching portions of the $BL_{m-1}$ and the $BL_{m+1}$ illustrate the reading results of the memory cells adjacent in the bit direction. It is possible to determine by using the reading results of the memory cells adjacent in the bit line direction whether or not the levels of the memory cells adjacent in the bit line direction are the C level.

The decoding unit 26 determines, by using the above-described information, whether or the influence of the adjacent cells is large. More specifically, for example, in a case where the number of memory cells of which levels are the C level among the memory cells adjacent in the word line direction and the bit line direction is equal to or larger than a threshold value, the decoding unit 26 selects the LLR table for canceling interference; and in a case where the number of memory cells of which levels are the C level is smaller than the threshold value, the decoding unit 26 selects the normal LLR table. For example, in the case of reading both of the $WL_{n-1}$ and the $WL_{n+1}$, the decoding unit 26 may obtain the information indicating whether or not the levels of the four memory cells adjacent to each memory cell are the C level except for the memory cells which are the ends in at least one of the WL direction and the BL direction. With respect to the memory cells which are the ends in both of the WL direction and the BL direction, for example, the memory cells of m=0 and n=0, the decoding unit 26 may obtain the information of the two memory cells adjacent thereto. In addition, with respect to the memory cells which are the end in only one of the WL direction and the BL direction, the decoding unit 26 may obtain the information of the three memory cells adjacent thereto.

With respect to the memory cells which are not the end in any one of the WL direction and the BL direction, the threshold value is set to, for example, 3. In a case where the number of memory cells of which levels are the C level among the fourth adjacent memory cells is equal to or larger than 3, the decoding unit 26 selects the LLR table for canceling interference; and in a case where the number of memory cells of which levels are the C level is less than 3, the decoding unit 26 selects the normal LLR table. With respect to the memory cells which are the ends in both of the WL direction and the BL direction, the threshold value is set to 1. With respect to the memory cells which are the end in only one of the WL direction and the BL direction, the threshold value is set to 2. In this manner, the threshold value is set according to the positions of the memory cells. Although the threshold value is set in any manner, for example, a threshold value having a small error after decoding is obtained by writing data in the memory cell and performing pre-evaluation.

Figure 13:
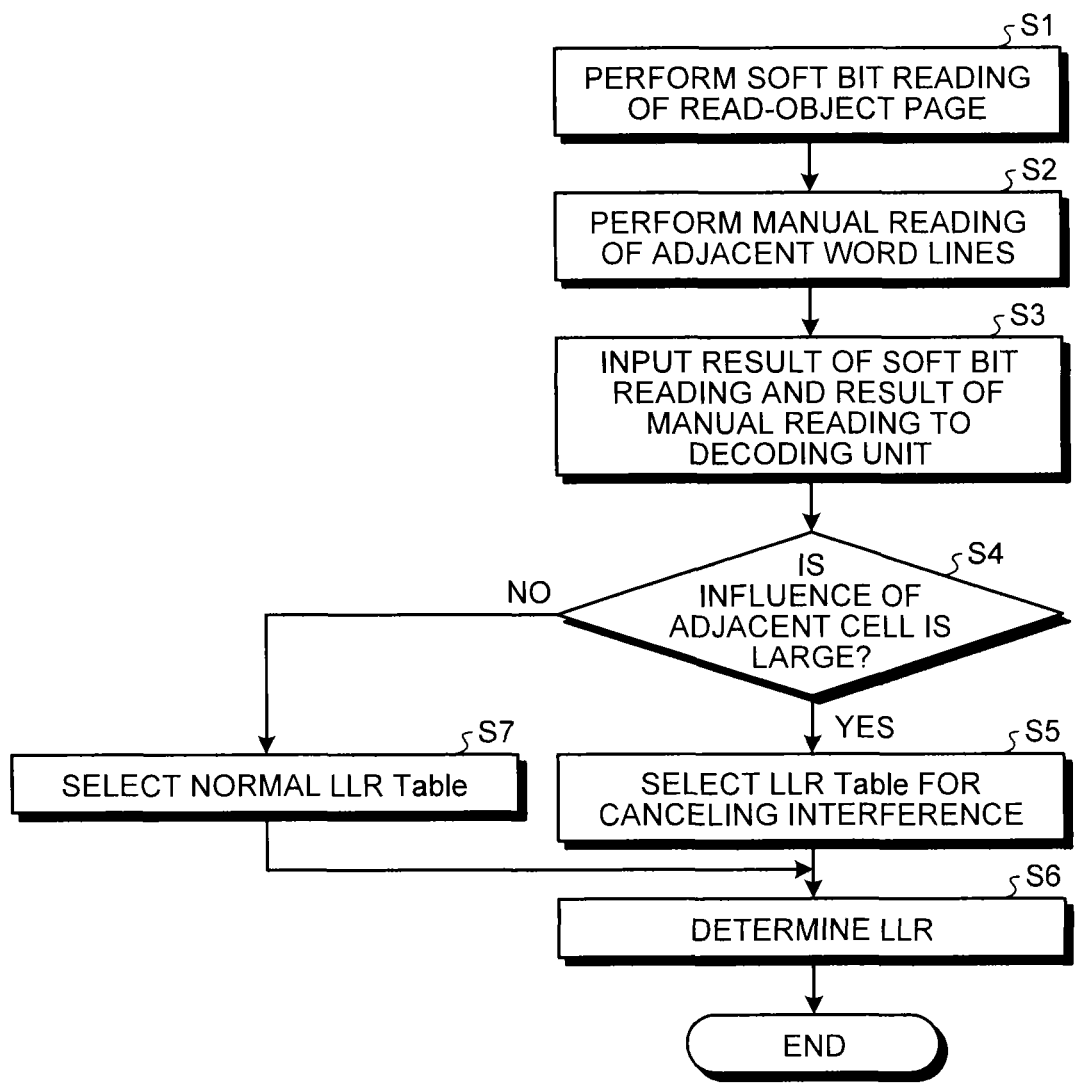
FIG. 13 is a diagram illustrating an example of an upper page reading procedure according to an embodiment.

FIG. 13 is a diagram illustrating an example of an upper page reading procedure according to an embodiment. First, the NAND control unit 32 performs the soft bit reading of the read-object word line according to the instructions from the memory controller 2 (step S1). Next, the NAND control unit 32 performs the reading (manual reading) of the word lines adjacent to the read-object word line by using the manual reading according to the instructions of the memory controller 2 (step S2). The manual reading is reading using a specified read voltage. In step S2, as described above, the reading is performed by specifying the boundary voltage Vr3 as the read voltage.

Next, the NAND control unit 32 inputs the result of the soft bit reading and the result of the manual reading to the decoding unit 26 via the NAND I/O interface 31 and the memory I/F 22 (step S3). The decoding unit 26 determines whether or not the influence of the adjacent cells is large (step S4).

Figure 14:
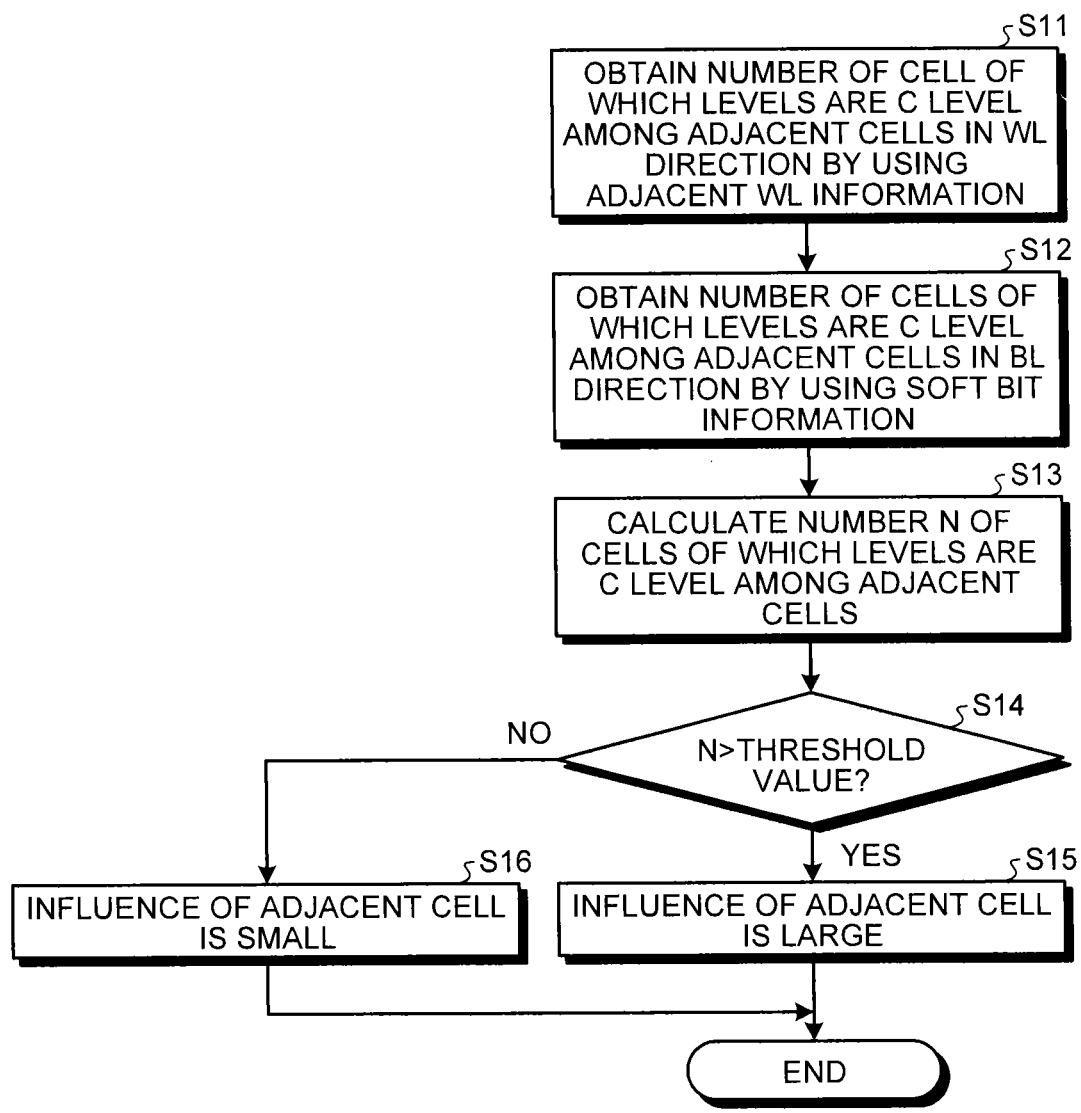
FIG. 14 is a diagram illustrating an example of a procedure of determining whether or not influence of adjacent cells is large.

FIG. 14 is a diagram illustrating an example of a procedure of determining whether or not the influence of the adjacent cells is large. The decoding unit 26 obtains the number of memory cells of which levels are the C level among the memory cells adjacent in the word line (WL) direction by using the adjacent-WL information (the SB4 or the SB4 and the SB5) (step S11). Next, the decoding unit 26 obtains the number of memory cells of which levels are the C level among the memory cells adjacent in the bit line (BL) direction by using the input soft bit information (including the hard determination value) (step S12).

Next, the decoding unit 26 calculates the number N of memory cells of which levels are the C level among the adjacent memory cells (step S13). The decoding unit 26 determines whether or not the N is equal to or larger than a threshold value (step S14). In a case where the N is equal to or larger than the threshold value (Yes in step S14), it is determined that the influence of the adjacent cells is large (step S15). In a case where the N is smaller than the threshold value (No in step S14), it is determined that the influence of the adjacent cells is small (step S16).

The description is made with respect to FIG. 13 again. In a case where the decoding unit 26 determines that the influence of the adjacent cells is large (Yes in step S4), the decoding unit 26 selects the LLR table for canceling interference (step S5), and the decoding unit 26 sets the LLR corresponding to the read-object memory cell by using the selected LLR table (step S6). In a case where the decoding unit 26 determines that the influence of the adjacent cells is small (No in step S4), the decoding unit 26 selects the normal LLR table (step S7), and the procedure proceeds to step S6.

According to the above-described processes, if the LLR corresponding to the ECC frame, that is, the LLR corresponding to one code word is set, the decoding unit 26 performs the decoding by using the LLR corresponding to the ECC frame. In a case where the interference of the adjacent cells is large, the decoding unit 26 may perform the decoding by using the LLR table for canceling interference, so that it is possible to reduce the error of the decoding.

In addition, in the description heretofore, although the number of memory cells of which levels are the C level among the adjacent memory cells is used to determine whether or not the influence of the adjacent cells is large, the method of determining whether or not the influence of the adjacent cells is large is not limited thereto. For example, scoring according to write levels of the adjacent cells is performed. Namely, the magnitudes of the threshold value voltages of the adjacent cells are scored. In a case where a total sum of the scores calculated by the scoring is equal to or larger than a threshold value, it may be determined that the influence of the adjacent cells is large. More specifically, for example, in a case where the level of the adjacent cell is the Er level, a score of 0 is set for the level; in a case where the level of the adjacent cell is the A level, a score of 1 is set for the level; in a case where the level of the adjacent cell is the B level, a score of 2 is set for the level; and in a case where the level of the adjacent cell is the C level, a score of 3 is set for the level. Next, the scores of the memory cells adjacent in the BL direction are obtained based on the reading results of the memory cells adjacent in the BL direction. With respect to the WL direction, since there is only the information indicating whether or not the levels of the adjacent memory cells are lower than the C level, in a case where the level of the adjacent memory cell is the C level, a score of 0 is set; and the in a case where the level of the adjacent memory cell is the C level, a score of 3 is set. Next, the total sum of the scores of the adjacent memory cells is obtained, and it is determined whether or not the total sum of the scores is equal to or larger than a threshold value.

In addition, in the embodiment, although the result obtained by applying the boundary voltage Vr3 as the read voltage to the adjacent word lines is defined as the SB4 (or the SB4 and the SB5), the read voltages applied to the adjacent word lines are not limited thereto. For example, the reading is performed by using the read voltage of −ΔR instead of the boundary voltage Vr3. The read voltages other than the boundary voltage Vr3 may be used.

In addition, in the embodiment, although the example using the two-bits/cell memory cells is described, even in a case where the memory cells other than the two-bits/cell memory cells are used, the LLR table may be selected by determining whether or not the influence of the adjacent cells is large. For example, in a case where three-bits/cell memory cells are used, levels Er, A, B, C, D, E, F, and G are set in the ascending order of the threshold value distribution. In general, in the three-bits/cell memory cells, since a width of the threshold value distribution becomes small in comparison with the two-bits/cell memory cells, a range where the influence of the adjacent cells is exerted is widened. Therefore, in the LLR table for canceling interference, the absolute values with respect to, for example, the B level as well as the A level may be set so as to be small in comparison with the normal LLR table. In addition, in the case of the three-bits/cell memory cells, in the reading of the adjacent word lines, instead of determining whether or not the level of the memory cell is equal to or larger than the C level, it may be determined whether or not the level of the memory cell is equal to or larger than, for example, the E level.

In addition, in the embodiment, although it is determined by using both of the reading results of the adjacent cells in the bit line direction and the reading results of the adjacent cells in the word line direction whether or not the inter-adjacent-cell interference is large, it may be determined by using any one of the reading results of the adjacent cells in the bit line direction and the reading results of the adjacent cells in the word line direction whether or not the inter-adjacent-cell interference is large.

In this manner described heretofore, in the embodiment, it is determined based on the write levels of the adjacent cells (data read from the adjacent cells) whether or not the influence of the adjacent cells is large, and the LLR table is selected based on the result of the determination. Therefore, it is possible to reduce an error of the read data after the decoding.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory controller controlling a nonvolatile memory, the memory controller comprising:
   a read control unit configured to control the nonvolatile memory to perform reading, the nonvolatile memory having a first memory cell, second to fifth memory cells adjacent to the first memory cell, a first word line connected to gates of the first, the fourth and the fifth memory cells, a second word line adjacent to the first word line and connected to a gate of the second cell, and a third word line adjacent to the first word line and connected to a gate of the third memory cell; and
   a decoding unit configured to determine whether or not influence of at least one of the second to the fifth memory cells on the first memory cell is large, and in a case where it is determined that the influence of the at least one of the second to the fifth memory cells on the first memory cell is large, to obtain likelihood information of the first memory cell based on a reading result from the first memory cell and a reading result from the at least one of the second to the fifth memory cells.

2. The memory controller according to claim 1,
   wherein the influence is inter-adjacent-cell interference,
   wherein the decoding unit determines based on a reading result of the at least one of the second to the fifth memory cells whether or not the influence of the at least one of the second to the fifth memory cells on the first memory cell is large.

3. The memory controller according to claim 2,
   wherein the likelihood information is defined as an LLR, and
   wherein the decoding unit retains a first LLR table and a second LLR table representing correspondence between the reading results from the first memory cells and LLRs, and in the second LLR table, the LLRs are set so that influence of interference from the at least one of the second to the fifth memory cells are canceled, and
   wherein the decoding unit in a case where it is determined that the interference is large, the decoding unit obtains the LLR of the first memory cell by using the second LLR table, and in a case where it is determined that the interference is not large, the decoding unit obtains the LLR of the first memory cell by using the first LLR table.

4. The memory controller according to claim 3,
wherein the first to a fifth memory cells which can store two bits by making correspondence between two bits and four threshold value distributions which are distributions of threshold value voltages, and
wherein, when the four threshold value distributions are defined as first to fourth threshold value distributions in the ascending order of threshold values, in the second LLR table, an absolute value of the LLR of the case where the reading result is the first threshold value distribution is large, and an absolute value of the LLR of the case where the reading result is the second threshold value distribution is small in comparison with the first LLR table.

5. The memory controller according to claim 2, wherein, in a case where the reading of memory cells connected to the first word line is performed, the read control unit instructs the nonvolatile memory to perform the reading of memory cells connected to the first word line according to soft bit reading and instructs the nonvolatile memory to perform the reading of memory cells connected to the second word line by using a first read voltage.

6. The memory controller according to claim 5, wherein the decoding unit determines based on the reading result of the second to the fifth memory cells whether or not the threshold value voltage of each of the second to the fifth memory cells is equal to or higher than the first read voltage, and obtains the number of memory cells of which threshold value voltage becomes the first read voltage among the third memory cell and the fourth memory cell, and in a case where the obtained number is equal to or larger than a threshold value, the decoding unit determines that the interference is large.

7. The memory controller according to claim 5, wherein the decoding unit scores a magnitude of the threshold value voltage of each of the second to the fifth memory cells based on the reading result of the second to the fifth memory cells, and in a case where a total sum of scores calculated by the scoring is equal to or larger than a threshold value, the decoding unit determines that the interference is large.

8. The memory controller according to claim 2,
wherein the decoding unit obtains likelihood information of the first memory cell based on the reading result from the first memory cell in a case where it is determined that the influence of the at least one of the second to the fifth memory cells on the first memory cell is not large.

9. The memory controller according to claim 8,
wherein the nonvolatile memory further includes a sixth memory cell adjacent to the fifth memory cell and connected to the second word line, and a seventh memory cell adjacent to the fifth memory cell and connected to the third word line,
wherein the decoding unit determines whether or not influence of at least one of the first, sixth and seventh memory cells on the fifth memory cell is large, and obtains likelihood information of the fifth memory cell based on a reading result from the fifth memory cell and a reading result from the at least one of the first, sixth and seventh memory cells in a case where it is determined that the influence of the at least one of the first, sixth and seventh memory cells on the fifth memory cell is large.

10. A storage device comprising:
a nonvolatile memory having a first memory cell, second to fifth memory cells adjacent to the first memory cell, a first word line connected to gates of the first, the fourth and the fifth memory cells, a second word line adjacent to the first word line and connected to a gate of the second memory cell, and a third word line adjacent to the first word line and connected to a gate of the third memory cell;
a read control unit configured to control the nonvolatile memory to perform reading; and
a decoding unit configured to determine whether or not influence of at least one of the second to the fifth memory cells on the first memory cell is large, and in a case where it is determined that the influence of the at least one of the second to the fifth memory cells on the first memory cell is large, to obtain likelihood information of the first memory cell based on a reading result from the first memory cell and a reading result from the at least one of the second to the fifth memory cells.

11. The storage device according to claim 10,
wherein the influence is inter-adjacent-cell interference,
wherein the decoding unit determines based on a reading result of the at least one of the second to the fifth memory cells whether or not the influence of the at least one of the second to the fifth memory cells on the first memory cell is large.

12. The storage device according to claim 11,
wherein the likelihood information is defined as an LLR, and
wherein the decoding unit retains a first LLR table and a second LLR table representing correspondence between the reading results from the first memory cells and LLRs, and in the second LLR table, the LLRs are set so that influence of interference from the at least one of the second to the fifth memory cells are canceled, and
wherein the decoding unit in a case where it is determined that the interference is large, the decoding unit obtains the LLR of the first memory cell by using the second LLR table, and in a case where it is determined that the interference is not large, the decoding unit obtains the LLR of the first memory cell by using the first LLR table.

13. The storage device according to claim 12,
wherein the first to a fifth memory cells which can store two bits by making correspondence between two bits and four threshold value distributions which are distributions of threshold value voltages, and
wherein, when the four threshold value distributions are defined as first to fourth threshold value distributions in the ascending order of threshold values, in the second LLR table, an absolute value of the LLR of the case where the reading result is the first threshold value distribution is large, and an absolute value of the LLR of the case where the reading result is the second threshold value distribution is small in comparison with the first LLR table.

14. The storage device according to claim 11, wherein, in a case where the reading of memory cells connected to the first word line is performed, the read control unit instructs the nonvolatile memory to perform the reading of memory cells connected to the first word line according to soft bit reading and instructs the nonvolatile memory to perform the reading of memory cells connected to the second word line by using a first read voltage.

15. The storage device according to claim 14, wherein the decoding unit determines based on the reading result of the second to the fifth memory cells whether or not the threshold value voltage of each of the second to the fifth memory cells is equal to or higher than the first read voltage, and obtains the number of memory cells of which threshold value voltage becomes the first read voltage among the third memory cell and the fourth memory cell, and in a case where the obtained number is equal to or larger than a threshold value, the decoding unit determines that the interference is large.

16. The storage device according to claim 14, wherein the decoding unit scores a magnitude of the threshold value voltage of each of the second to the fifth memory cells based on the reading result of the second to the fifth memory cells, and in a case where a total sum of scores calculated by the scoring is equal to or larger than a threshold value, the decoding unit determines that the interference is large.

17. The storage device according to claim 11,
wherein the decoding unit obtains likelihood information of the first memory cell based on the reading result from the first memory cell in a case where it is determined that the influence of the at least one of the second to the fifth memory cells on the first memory cell is not large.

18. The storage device according to claim 17,
wherein the nonvolatile memory further includes a sixth memory cell adjacent to the fifth memory cell and connected to the second word line, and a seventh memory cell adjacent to the fifth memory cell and connected to the third word line,
wherein the decoding unit determines whether or not influence of at least one of the first, sixth and seventh memory cells on the fifth memory cell is large, and obtains likelihood information of the fifth memory cell based on a reading result from the fifth memory cell and a reading result from the at least one of the first, sixth and seventh memory cells in a case where it is determined that the influence of the at least one of the first, sixth and seventh memory cells on the fifth memory cell is large.

19. A memory control method of controlling a nonvolatile memory, comprising:
controlling the nonvolatile memory to perform reading, the nonvolatile memory having a first memory cell, a second to a fifth memory cells adjacent to the first memory cell, a first word line connected to gates of the first, the fourth and the fifth memory cells, a second word line adjacent to the first word line and connected to a gate of the second memory cell, and a third word line adjacent to the first word line and connected to a gate of the third memory cell;
determining whether or not influence of at least one of the second to the fifth memory cells on the first memory cell is large, and
obtaining, in a case where it is determined that the influence of the at least one of the second to the fifth memory cells on the first memory cell is large, likelihood information of the first memory cell based on a reading result from the first memory cell and a reading result from the at least one of the second to the fifth memory cells.

* * * * *